United States Patent
Cao et al.

(10) Patent No.: US 7,796,390 B1
(45) Date of Patent: Sep. 14, 2010

(54) FASTENER AND HEAT SINK ASSEMBLY HAVING THE SAME

(75) Inventors: Lei Cao, Shenzhen (CN); Min Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

(*) Notice: Subject to any disclaimer, the term of this patent is extended or adjusted under 35 U.S.C. 154(b) by 0 days.

(21) Appl. No.: 12/492,149

(22) Filed: Jun. 26, 2009

(30) Foreign Application Priority Data

Mar. 25, 2009 (CN) .......................... 200910301136

(51) Int. Cl.
*H05K 7/20* (2006.01)

(52) U.S. Cl. .................. 361/704; 361/719; 257/718; 257/719; 165/80.3

(58) Field of Classification Search ................ None
See application file for complete search history.

(56) References Cited

U.S. PATENT DOCUMENTS

| | | | | |
|---|---|---|---|---|
| 6,307,748 B1* | 10/2001 | Lin et al. | ..................... | 361/704 |
| 7,042,727 B2* | 5/2006 | Ulen et al. | ................... | 361/704 |
| 7,126,823 B2* | 10/2006 | Chen et al. | ................... | 361/702 |
| 7,180,743 B2* | 2/2007 | Chen et al. | ................... | 361/704 |
| 7,342,796 B2* | 3/2008 | Aukzemas | ................... | 361/719 |
| 7,359,200 B2* | 4/2008 | Zhou et al. | ................... | 361/704 |
| 7,606,031 B2* | 10/2009 | Hsieh et al. | ................. | 361/700 |
| 2007/0217159 A1* | 9/2007 | Long et al. | ................... | 361/704 |

* cited by examiner

*Primary Examiner*—Boris L Chervinsky
(74) *Attorney, Agent, or Firm*—Frank R. Niranjan

(57) ABSTRACT

A heat sink assembly is mounted on a printed circuit board to dissipate heat generated by an electronic component. The heat sink assembly includes a heat sink and a plurality of fasteners fixing the heat sink to the printed circuit board. The fastener includes a head, a post extending downwardly from the head through the heat sink, an elastic member encircling the post and compressed between the head and the heat sink, and an engaging member fixed to the printed circuit board. A top of the engaging member is fastened to a bottom of the post. When the post, together with the head, is rotated relative to an axis thereof toward a locked position, the post would be driven by the engaging member to automatically lock with the engaging member at the locked position.

18 Claims, 7 Drawing Sheets

FASTENER AND HEAT SINK ASSEMBLY HAVING THE SAME

BACKGROUND

1. Technical Field

The disclosure generally relates to fasteners and, more particularly, to a fastener capable of conveniently assembling and disassembling a heat sink on and from a printed circuit board, and a heat sink assembly including such a fastener.

2. Description of Related Art

Electronic components, such as central processing units (CPUs) comprise numerous circuits operating at high speed and generating substantial heat. Under most circumstances, it is necessary to cool the CPUs in order to maintain safe operating conditions and assure that the CPUs function properly and reliably. In the past, various approaches have been used to cool electronic components. Typically, a finned metal heat sink is attached to an outer surface of the CPU to remove the heat therefrom. The heat absorbed by the heat sink is then dissipated to ambient air. The related finned metal heat sink is made of highly heat-conductive metal, such as copper or aluminum, and generally comprises a base contacting the CPU to absorb the heat therefrom and a plurality of fins formed on the base for dissipating the heat.

Conventionally, a linear-type clip is used to secure the heat sink to the heat generating electronic device by fastening the heat sink to a printed circuit board on which the heat generating device is mounted. The linear-type clip, which is integrally made from a resilient metal wire, generally includes an elongated pressing portion and a pair of locking arms extending from opposite ends of the elongated pressing portion in opposite directions. When assembled, the elongated pressing portion of the clip abuts against the base of the heat sink toward the heat generating device, and the locking arms are resiliently engaged with clasps provided on the printed circuit board to thereby secure the heat sink to the heat generating electronic device.

In order to ensure a reliable securement between the heat sink and the heat generating device, the clip has to be deformed largely to produce a large pressure on the heat sink, which requires a user to manipulate the clip with a large force during assembling. However, due to having the resilient linear-type structure, the clip can only provide a very limited contacting area to be handled. It is very inconvenient for the user to apply such a large force on the very limited contacting area of the clip. Accordingly, the assembly efficiency thereof is low.

What is needed, therefore, is a fastener capable of overcoming the above-described problems.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
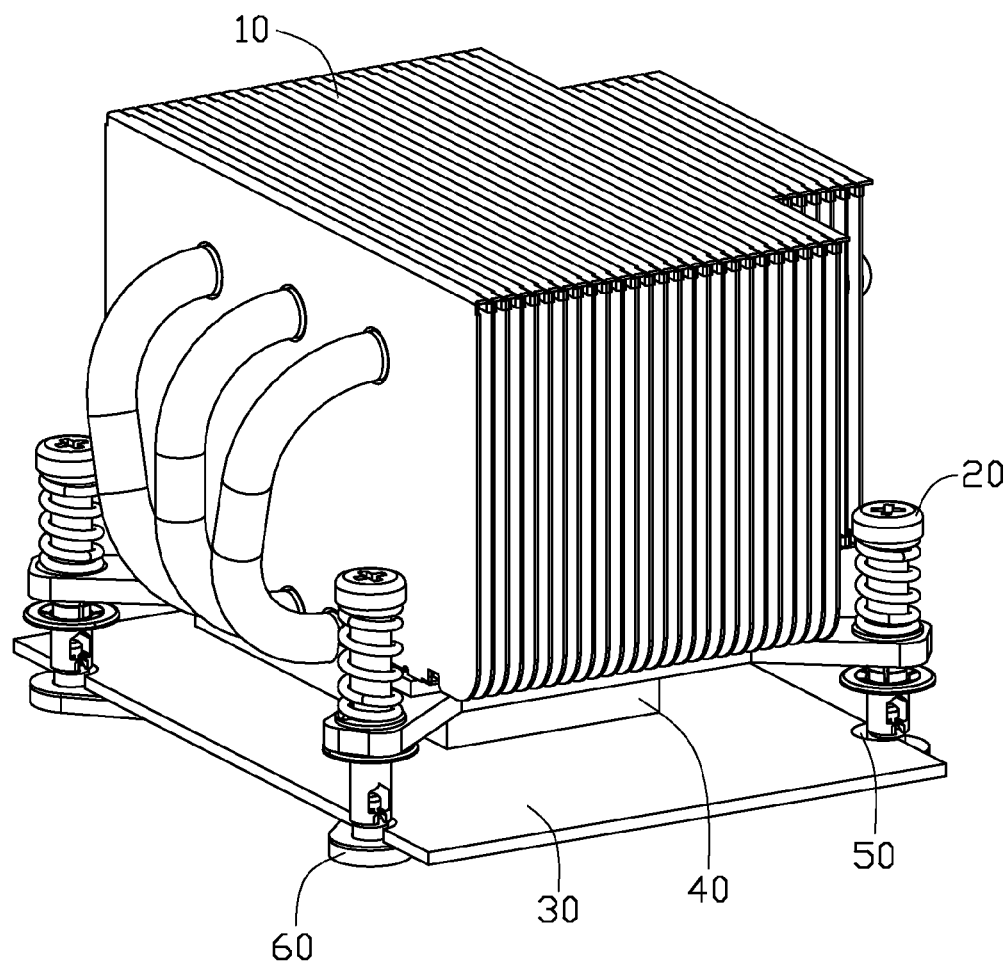
FIG. 1 is an assembled, isometric view of a heat sink assembly with a printed circuit board in accordance with an embodiment of the disclosure.
Figure 2:
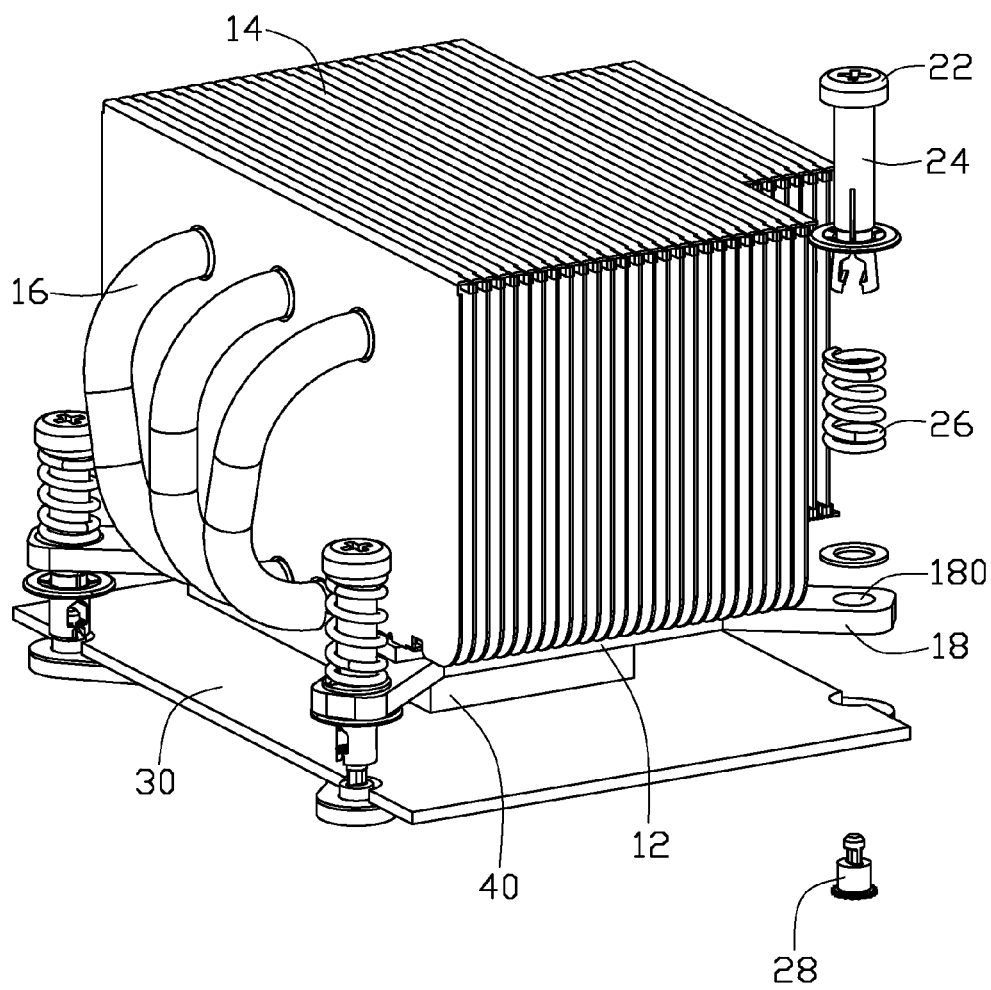
FIG. 2 is an exploded view of the heat sink assembly with the printed circuit board of FIG. 1.

Referring to FIGS. 1-2, a heat sink assembly in accordance with an embodiment of the disclosure is mounted on a printed circuit board 30 to dissipate heat generated by an electronic component 40 on the printed circuit board 30. The heat sink assembly comprises a heat sink 10 and four fasteners 20 fixing the heat sink 10 to the printed circuit board 30. The printed circuit board 30 defines four through holes 50 near two pairs of diagonally opposite corners of the electronic component 40.

The heat sink 10 is made of metal with good heat conductivity, such as aluminum, copper, or alloys thereof. The heat sink 10 comprises a rectangular base 12, a plurality of fins 14 extending upwardly from a top face of the base 12 and a plurality of heat pipes 16 connecting the fins 14 to the base 12. The fins 14 are spaced from and parallel to each other. A passage is defined between every two adjacent fins 14 to allow an airflow therethrough. Two pairs of ears 18 extend from two pairs of diagonally opposite corners of the base 12, respectively. Each ear 18 defines a mounting hole 180 adjacent to a distal end thereof. The mounting holes 180 of the ears 18 are located corresponding to the through holes 50 of the printed circuit board 30. The heat pipes 16 are juxtaposed to each other. Each of the heat pipes 16 has a U-shaped configuration and comprises two parallel heat-conducting sections and an arced connecting section interconnecting the two heat-conducting sections. One of the two heat-conducting sections of each heat pipe 16 is sandwiched between the base 12 and the fins 14. Another one of the two heat-conducting sections of each heat pipe 16 extends perpendicularly through and thermally connects the fins 14.

Figure 3:
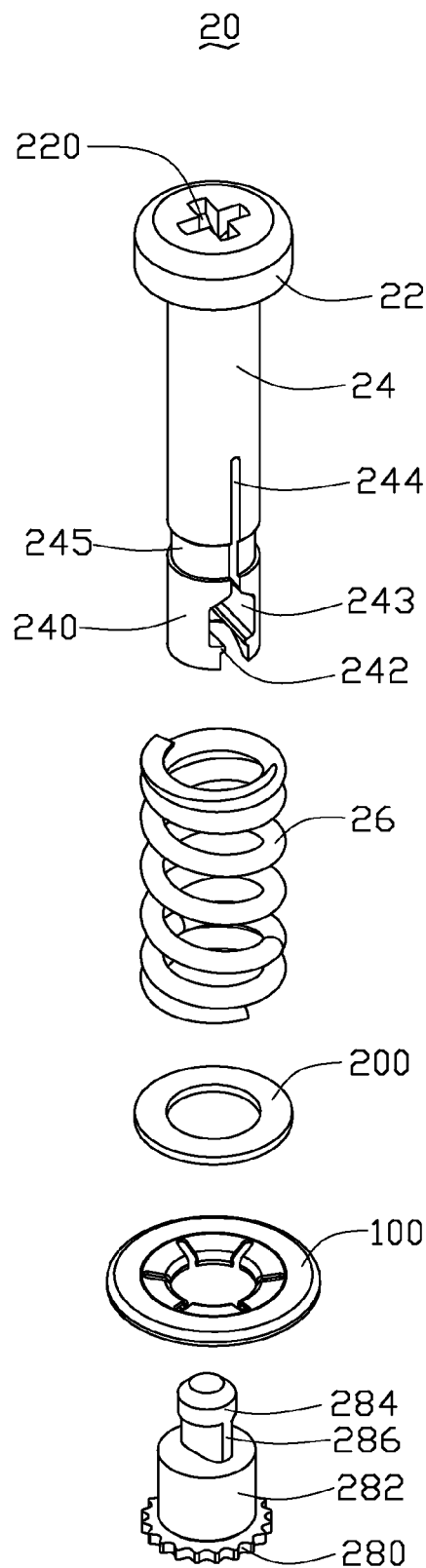
FIG. 3 is an exploded view of a fastener of the heat sink assembly of FIG. 1.
Figure 4:
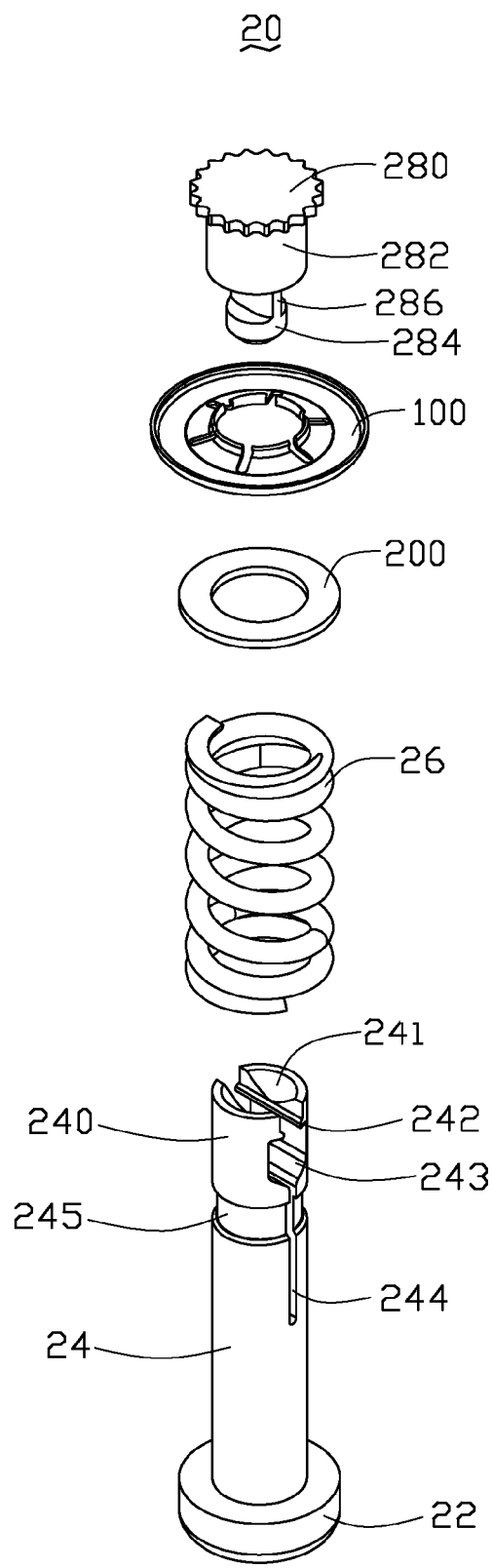
FIG. 4 is an inverted view of FIG. 3.

Also referring to FIGS. 3-4, each fastener 20 comprises a cap-shaped head 22, a post 24 extending downwardly from a bottom of the head 22, an elastic member 26 such as a spring positioned around the post 24 and an engaging member 28 engaging with a bottom of the post 24. A crisscross groove 220 is defined in a top face of the head 22 adapted for facilitating a tool to operate the fastener 20. The post 24 has a cylindrical configuration. A diameter of the post 24 is less than that of the head 22. A bottom of the post 24 symmetrically splits up to two opposite parts, whereby a pair of locking arms 240 are formed. The two locking arms 240 define a gap 244 therebetween. A bottom face of each locking arm 240 is concaved upwardly to form a tapered guiding face. The two tapered guiding faces of the two locking arms 240 cooperatively define a guiding portion 241 in an inverted funnel-shape (see FIG. 4). Two elongated baffle ribs 242 project inwardly and horizontally from inner faces of the two locking arms 240, respectively. The two baffle ribs 242 are oriented towards each other and positioned above the guiding portion 241. A part of the gap 244 which is positioned above the baffle ribs 242 is expanded, thereby forming a receiving portion 243 having a width greater than other parts of the gap 244. The post 24 defines an annular groove 245 along a circumference thereof. The groove 245 is located at a middle of the locking arms 240 and higher than the receiving portion 243. The fastener 20 is further provided with a fastening collar 100 received in the groove 245 and hooping the two locking arms 240. The engaging member 28 is fixed to a back plate 60 which is positioned at a bottom side of the printed circuit board 30 opposite to the electronic component 40. The engaging member 28 extends through a corresponding through hole 50 of the printed circuit board 30 for engaging with the two locking arms 240 of the post 24. The engaging member 28 comprises a circular plate 280, a cylindrical main body 282 extending upwardly from a top face of the plate 280, a knob 284 and a vertical supporting portion 286 extending from a top face of the main body 282 and supporting the knob 284. The plate 280 of the engaging member 28 is mounted in the back plate 60. A circumference of the plate 280 has a toothed structure for tightly engaging with the back plate 60, thereby preventing the engaging member 28 from rotation when assembling the heat sink 10 to the back plate 60. The knob 284 is inserted into the receiving portion 243 through the guiding portion 241 of the post 24. A circumference of a top end of the knob 284 is chamfered for fitting with the guiding portion 241 of the post 24, thereby facilitating locking of the engaging member 28 to the post 24. The plate 280 is coaxial with the main body 282 and the knob 284. The supporting portion 286 is a vertically-extended, flat plate, having a rectangular shape. The supporting portion 286 is perpendicular to the main body 282 and the knob 284. Two opposite outer faces of the supporting portion 286 are continuous with an outer circumference of the knob 284. A distance between the two opposite outer faces of the supporting portion 286, i.e., the thickness of the supporting portion 286, is less than or equal to a distance between the two baffle ribs 242. A distance between another two opposite outer faces of the supporting portion 286, i.e., the width of the supporting portion 286, is less than that a diameter of the knob 284 and larger than the distance between the two baffle ribs 242. A bottom of the knob 284 forms two steps symmetrically located at two opposite lateral sides of the supporting portion 286 respectively.

Figure 5:
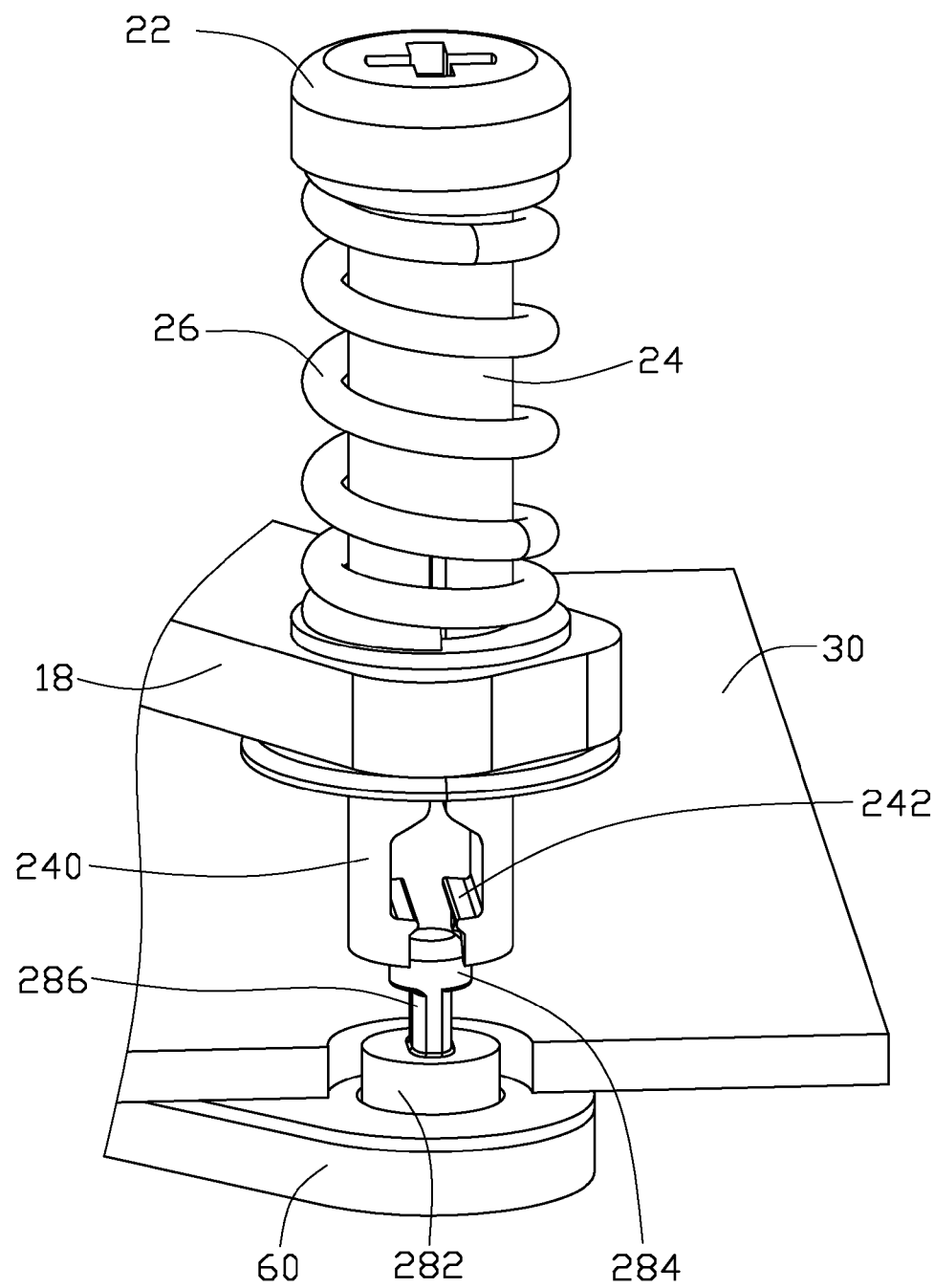
FIG. 5 is a partially enlarged view of the heat sink assembly with the printed circuit board of FIG. 1, wherein the fastener of the heat sink assembly is pre-assembled.
Figure 6:
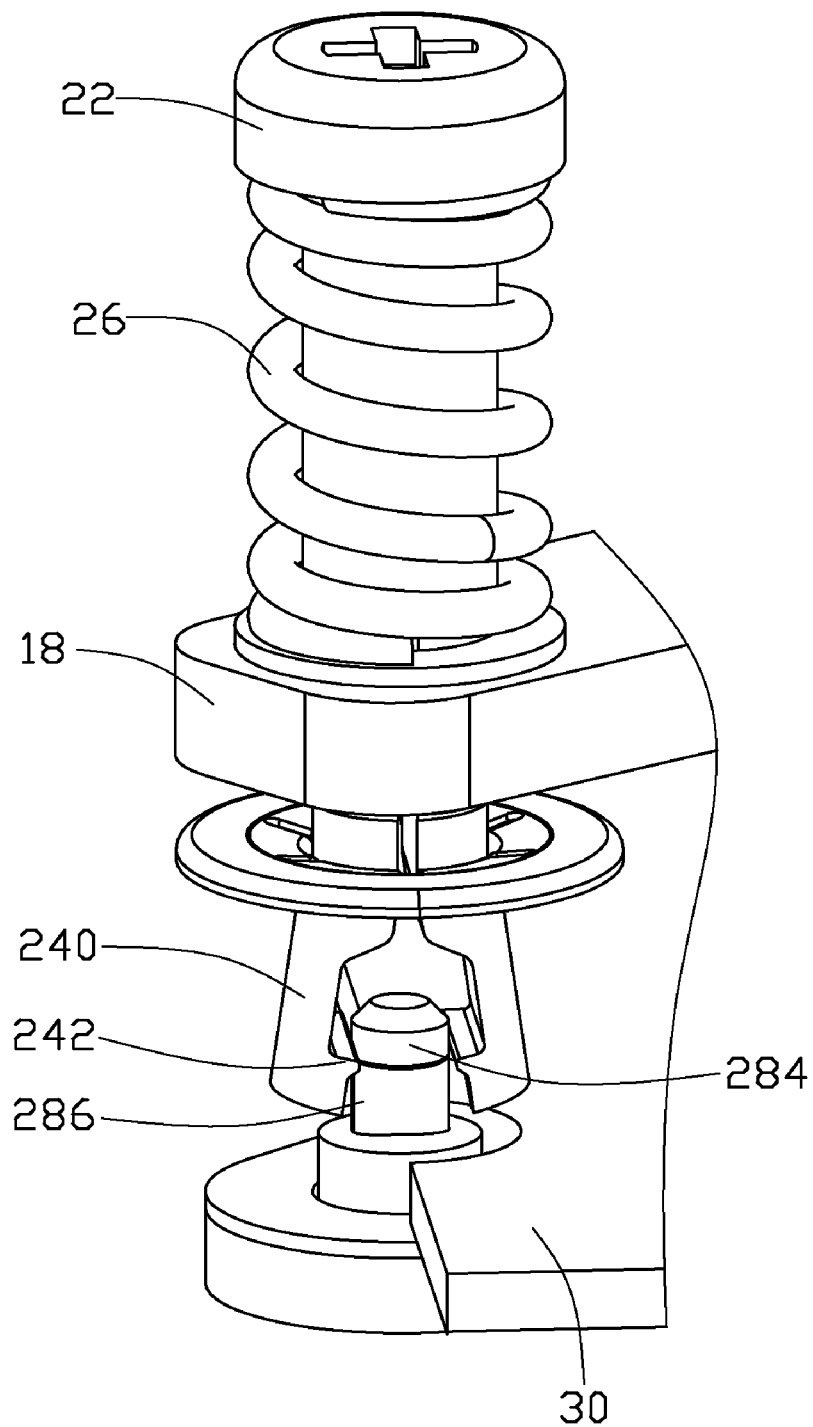
FIG. 6 is a partially enlarged view of the heat sink assembly with the printed circuit board of FIG. 1, wherein the fastener is unlocked.
Figure 7:
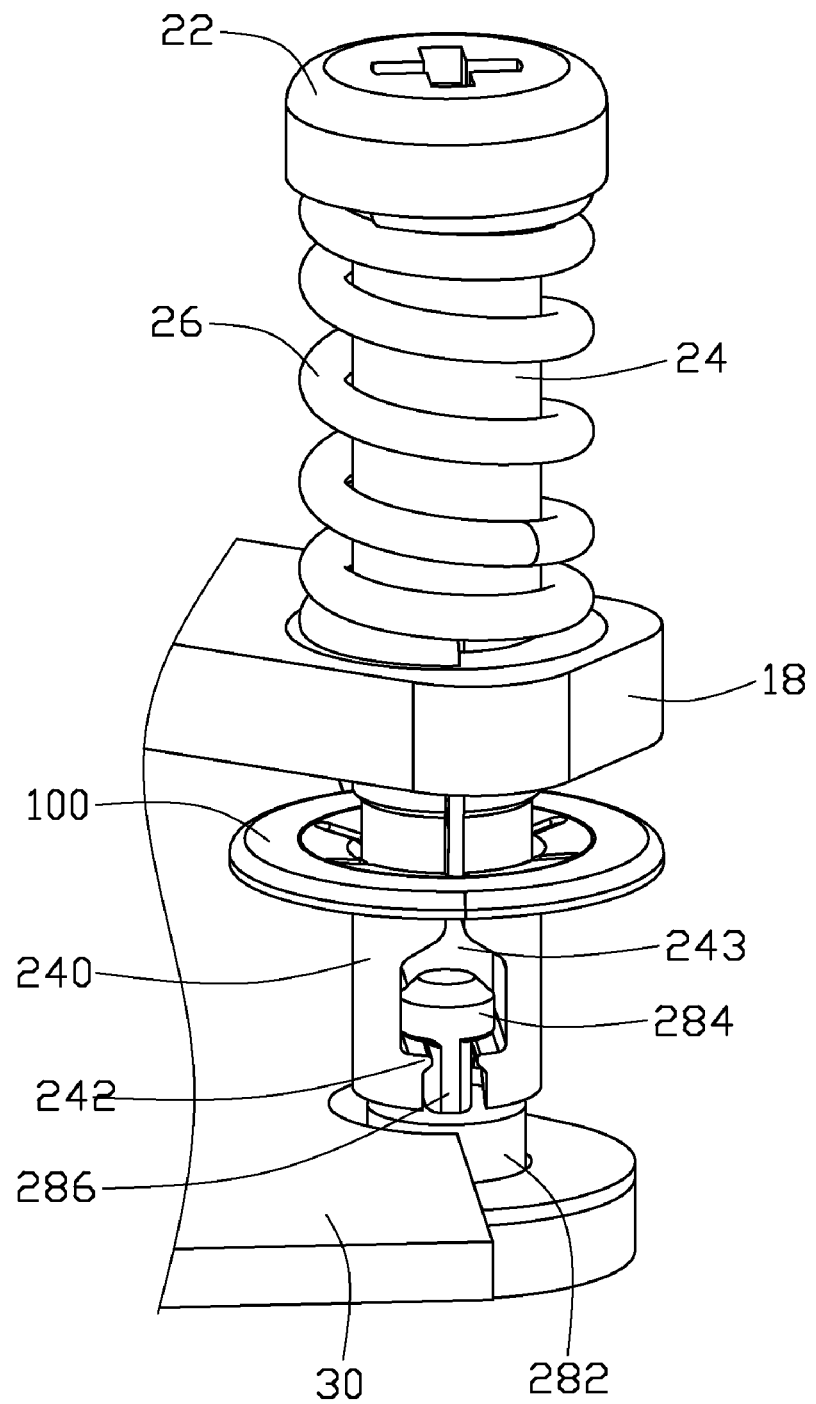
FIG. 7 is a partially enlarged view of the heat sink assembly with the printed circuit board of FIG. 1, wherein the fastener is locked.

Also referring to FIGS. 5 through 7, in assembly of the present heat sink assembly, the heat sink 10 is disposed on the electronic component 40 mounted on the printed circuit board 30. The engaging members 28 of the fastener 20 are fixed to the back plate 60 and correspondingly extend through the through holes 50 of the printed circuit board 30. The post 24 of each fastener 20 extends through the corresponding mounting hole 180 of the base 12 of the heat sink 10. The elastic member 26 is compressed between the head 22 of the fastener 20 and an annular gasket 200 hooping the post 24 of the fastener 20 and sitting on the ear 18 of the base 12. The fastening collar 100 is placed below the ear 18 to snap the post 24 at the groove 245. Thus, the fastener 20 is preassembled to the heat sink 10 and the back plate 60 as shown in FIG. 5. At this position, the engaging member 28 is released from the post 24 with the knob 284 of the engaging member 28 readily fitting in the guiding portion 241 of the post 24. Then the post 24 is pressed downwardly by the tool, wherein the two arms 240 split outwardly by insertion of the knob 284 of the engaging member 28 into the receiving portion 243 of the post 24. As the knob 284 substantially entering the receiving portion 243 of the post 24, the tool is released from the head 22 to facilitate locking of the fastener 20. Two different situations may appear in the locking of the fastener 20 depending upon relative positions between the engaging member 28 and the post 24: if the supporting portion 286 of the engaging member 28 is not parallel to the gap 244 between the two arms 240 as shown in FIG. 6, due to the supporting portion 286 expanding the gap 244 between the two baffle ribs 242, a torsion force would be produced to force the post 24 to rotate with respect to the supporting portion 286 of the engaging member 28. Until the post 24 is rotated to a position where the gap 244 between the two arms 240 is parallel to the supporting portion 286 of the engaging member 28, the gap 244 would return its original width where the supporting portion 286 could be fittingly received between the two baffle ribs 242, whereby the post 24 is locked with the engaging member 28. If the supporting portion 286 of the engaging member 28 is parallel to the gap 244, the post 24 would be directly locked with the engaging member 28 without rotation. At the fixed position shown in FIG. 7, the knob 284 of the engaging member 28 is sandwiched between two locking arms 240 of the post 24 and received in the receiving portion 243, the two baffle ribs 242 press on the bottom face of the knob 284 and are positioned oppositely relative to the supporting portion 286 of the engaging member 28. The compressed elastic member 26 generates a resilient force on the heat sink 10 and the head 22. The head 22 together with the post 24 is pushed upwardly by the resilient force, and the knob 284 of the engaging member 28 clasped by the two locking arms 240 of the post 24 is pulled upwardly by the post 24, thereby driving the back plate 60 engaging with the engaging members 28 to abut against the printed circuit board 30 upwardly. On the other hand, the heat sink 10 is urged downwardly towards the printed circuit board 30 by the resilient force. Thus, the heat sink 10 is firmly attached to the electronic component 40 mounted on the printed circuit board 30 by the fasteners 20.

Referring to FIGS. 1 through 7 again, in disassembly of the present heat sink assembly, the head 22, together with the post 24, is rotated along clockwise or anti-clockwise direction relative to an axis thereof towards a released position where the supporting portion 286 of the engaging member 28 is perpendicular to the gap 244 between the two arms 240, the two baffle ribs 242 of the two locking arms 240 are rotated relative to the supporting portion 286 of the engaging member 28, and the two locking arms 240 are splayed gradually by the supporting portion 286. When the released position is reached where the baffle ribs 242 no longer abut against the bottom face of the knob 284, the locking arms 240 are pushed to move upwardly by the force generated by the elastic member 26 and finally escape from the engaging member 28.

Due to automatic-locking structure of the fastener 20, the heat sink 10 can be conveniently assembled to or disassembled from the printed circuit board 30 just by rotation of the head 22 of the fastener 20; thus, the assembling and disassembling efficiency of the heat sink assembly is improved.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A fastener adapted for assembling a heat sink on a top of a printed circuit board together, comprising:
 a head;
 a post extending downwardly from a bottom face of the head, adapted for extending through the printed circuit board;
 an elastic member encircling the post and positioned under the head, adapted to be compressed between the heat sink and head; and an engaging member engaging with a bottom of the post and adapted to be secured to a bottom of the printed circuit board and extending upwardly through the printed circuit board;

wherein when the post, together with the head, is rotated relative to an axis thereof from a first position in which the bottom of the post and the engaging member are not locked with each other toward a second position, a relative movement would occur between the post and the engaging member to automatically cause the post to lock with the engaging member at the second position.

2. The fastener as claimed in claim 1, wherein the bottom of the post splits up into two opposite parts to form a pair of locking arms, and the two locking arms define a gap therebetween.

3. The fastener as claimed in claim 2, wherein two elongated baffle ribs project inwardly from inner faces of two locking arms, respectively, and the two baffle ribs are oriented towards each other.

4. The fastener as claimed in claim 3, wherein a part of the gap which is positioned above the baffle ribs is expanded, thereby forming a receiving portion.

5. The fastener as claimed in claim 4, wherein the engaging member comprises a main body, a knob clasped by the locking arms and a vertical supporting portion extending from a top face of the main body and supporting the knob.

6. The fastener as claimed in claim 5, wherein the knob is sandwiched between the two locking arms and received in the receiving portion of the post.

7. The fastener as claimed in claim 6, wherein the two baffle ribs abut against a bottom of the knob.

8. The fastener as claimed in claim 5, wherein the supporting portion has a thickness less than or equal to a distance between the two baffle ribs, and a width larger than the distance between the two baffle ribs.

9. The fastener as claimed in claim 5, wherein when the post, together with the head, is rotated relative to the axis thereof from the second position to a third position in which the baffle ribs of the two locking arms are perpendicular to the supporting portion, the locking arms being detachable from the knob.

10. A heat sink assembly adapted to dissipate heat generated by an electronic component mounted on a top face of a printed circuit board, the heat sink assembly comprising:

a heat sink comprising a base disposed on the electronic component, the base defining a plurality of mounting holes; and a plurality of fasteners extending through the mounting holes of the heat sink, respectively, to assemble the heat sink to the printed circuit board, each of the plurality of fasteners comprising:

a head, a post extending downwardly from a bottom face of the head and extending through the mounting hole of the heat sink;

an elastic member encircling the post and compressed between the head and the base; and an engaging member fixed to the printed circuit board, a top of the engaging member engaging a bottom of the post;

wherein when the post together with the head, is rotated relative to an axis thereof from a first position in which the bottom of the post and the engaging member are not locked with each other toward a second position, a torsion force will be produced by the engaging member to the post to thereby drive the post to lock with the engaging member.

11. The heat sink assembly as claimed in claim 10, wherein the bottom of the post splits up into two opposite locking arms, a gap being defined between the two locking arms.

12. The heat sink assembly as claimed in claim 11, wherein two elongated baffle ribs project inwardly from inner faces of the two locking arms towards each other, respectively, the two locking arms clasping the engaging member.

13. The heat sink assembly as claimed in claim 12, wherein the engaging member comprises a main body fixed to the printed circuit board, a knob clasped by the two locking arms and a vertical supporting portion interconnecting a top face of the main body and a bottom face of the knob.

14. The heat sink assembly as claimed in claim 13, wherein the post defines a receiving portion positioned above the two baffle ribs for receiving the knob of the engaging member.

15. The heat sink assembly as claimed in claim 13, wherein the two baffle ribs abut against a bottom face of the knob.

16. The heat sink assembly as claimed in claim 13, wherein a part of an outer periphery of the supporting portion is continuous with an outer periphery of the knob.

17. The heat sink assembly as claimed in claim 13, wherein the supporting portion is fittingly received in the gap when the post is rotated to the second position, and splays the two locking arms outwardly when the post is rotated from the second position toward the first position.

18. The heat sink assembly as claimed in claim 17, wherein the two locking arms are detachable from the knob when the baffle ribs are perpendicular to the supporting portion.

* * * * *